United States Patent
Tsai

(10) Patent No.: US 8,792,218 B2
(45) Date of Patent: Jul. 29, 2014

(54) ELECTROSTATIC DISCHARGE PROTECTION CIRCUIT AND METHOD FOR RADIO FREQUENCY SEMICONDUCTOR DEVICE

(75) Inventor: Ming Hsien Tsai, New Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 202 days.

(21) Appl. No.: 13/332,095

(22) Filed: Dec. 20, 2011

(65) Prior Publication Data

US 2013/0155556 A1    Jun. 20, 2013

(51) Int. Cl.
*H02H 9/00* (2006.01)

(52) U.S. Cl.
USPC .............................. 361/56; 361/91.1; 361/111

(58) Field of Classification Search
None
See application file for complete search history.

(56) References Cited

U.S. PATENT DOCUMENTS

| | | | |
|---|---|---|---|
| 6,885,534 B2 * | 4/2005 | Ker et al. | 361/113 |
| 6,894,567 B2 * | 5/2005 | Vickram et al. | 330/298 |
| 7,009,826 B2 | 3/2006 | Ker et al. | |
| 7,023,677 B2 | 4/2006 | Ker et al. | |
| 7,023,678 B2 | 4/2006 | Ker et al. | |
| 7,224,949 B2 * | 5/2007 | Kluge et al. | 455/217 |

OTHER PUBLICATIONS

Huang, Bo-Jr, et al., "Design and Analysis for a 60-GHZ Low-Noise Amplifier with RF ESD Protection", IEEE Transactions on Microwave Theory and Techniques, vol. 57, No. 2, Feb. 2009, pp. 298-305.

* cited by examiner

*Primary Examiner* — Jared Fureman
*Assistant Examiner* — Terrence Willoughby
(74) *Attorney, Agent, or Firm* — Lowe Hauptman & Ham LLP

(57) ABSTRACT

An ESD protection circuit for an RF semiconductor device includes an RF input pad configured to receive an RF input signal having an RF operating frequency for the RF semiconductor device. A first ESD block is coupled between an intermediate node and the first power supply voltage terminal, to direct an ESD pulse of a first polarity toward the first power supply voltage terminal. A second ESD block is coupled between the intermediate node and the second power supply voltage terminal, to direct an ESD pulse of a second, opposite polarity toward the second power supply voltage terminal. A resonance circuit is coupled between the RF input pad and the intermediate node. The resonance circuit is configured to present a greater impedance to the RF input signal having the RF operating frequency than to the ESD pulses.

20 Claims, 5 Drawing Sheets

ELECTROSTATIC DISCHARGE PROTECTION CIRCUIT AND METHOD FOR RADIO FREQUENCY SEMICONDUCTOR DEVICE

BACKGROUND

The recent trend in miniaturizing integrated circuits (ICs) has resulted in smaller devices which consume less power, yet provide more functionally at higher speeds than before. The miniaturization process has also increased the devices' susceptibility to electrostatic discharge (ESD) events due to various factors, such as thinner dielectric thicknesses and associated lowered dielectric breakdown voltages. ESD is one of the causes of electronic circuit damage and is also one of the considerations in semiconductor advanced technology.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
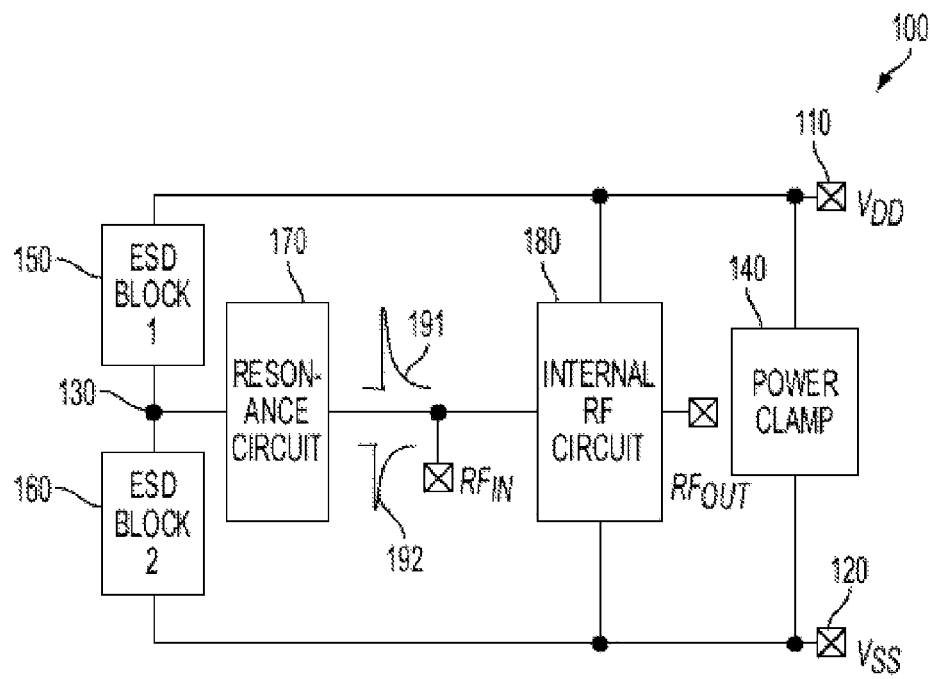
FIG. 1 is a schematic block diagram of an ESD protection circuit in accordance with some embodiments.

It is to be understood that the following disclosure provides many different embodiments or examples, for implementing different features of various embodiments. Specific examples of components and arrangements are described below to simplify the present disclosure. The inventive concept may, however, be embodied in many different forms and should not be construed as being limited to the embodiments set forth herein; rather, these embodiments are provided so that this description will be thorough and complete, and will fully convey the inventive concept to those of ordinary skill in the art. It will be apparent, however, that one or more embodiments may be practiced without these specific details.

The drawings are not drawn to scale, and include certain features that are exaggerated for clarity. Like reference numerals in the drawings denote like elements. The elements and regions illustrated in the figures are schematic in nature, and thus relative sizes or intervals illustrated in the figures are not intended to limit the scope of the inventive concept.

FIG. 1 is a schematic block diagram of an ESD protection circuit 100 in accordance with some embodiments. The ESD protection circuit 100 includes a first power supply voltage terminal 110, a second power supply voltage terminal 120, and an intermediate node 130. The ESD protection circuit 100 further includes a power clamp 140, first and second ESD blocks 150, 160, and a resonance circuit 170.

The ESD protection circuit 100 is arranged to protect an internal radio frequency (RF) circuit 180 from ESD events. The ESD protection circuit 100 and the RF circuit 180 together define an RF semiconductor device. In some embodiments, the ESD protection circuit 100 and RF circuit 180 are incorporated in a single IC, or on a single substrate. In some embodiments, the RF circuit 180 includes one or more semiconductor components. In some embodiments, the RF circuit 180 includes one or more complementary metal-oxide-semiconductor (CMOS) components. The RF circuit 180 is configured to receive, process and/or output RF signals. In some embodiments, the RF operating frequency at which the RF circuit 180 is configured to operate is in the GHz spectrum and higher. In some embodiments, the RF operating frequency of the RF circuit 180 is 60 GHz and up to the THz spectrum. In some embodiments, the RF circuit 180 includes an RF millimeter-wave front-end circuit.

The RF circuit 180 is coupled to the first power supply voltage terminal 110 and second power supply voltage terminal 120, and includes an RF input pad $RF_{in}$. In some embodiments, the RF circuit 180 further includes an RF output pad $RF_{out}$. The RF input pad $RF_{in}$ is arranged to receive an RF input signal having an RF operating frequency at which the RF circuit 180 is configured to operate. During ESD events, ESD pulses of different polarities are applied to the RF input pad $RF_{in}$. Without the ESD protection circuit 100, such ESD events cause excessive and potentially damaging voltages or currents in the RF circuit 180.

The first power supply voltage terminal 110 is configured to receive a first power supply voltage for the RF circuit 180, and the second power supply voltage terminal is configured to receive a second power supply voltage for the RF circuit 180. In some embodiments, the first power supply voltage is a positive power supply voltage VDD, and the second power supply voltage is a ground voltage. Other power supply arrangements are within the scope of this disclosure.

The power clamp 140 is coupled between the first and second power supply voltage terminals 110, 120. The power clamp 140 is a normally nonconductive device which is nonconductive during normal operation of the RF circuit 180. Specifically, the power clamp 140 is nonconductive if the voltage difference between the first power supply voltage terminal 110 and the second power supply voltage terminal 120 is within a predetermined range, e.g., around (VDD-VSS). When the voltage difference across the power clamp 140 is greater than a threshold voltage of the power clamp 140, the power clamp 140 is configured to conduct the current from the first power supply voltage terminal 110 to the second power supply voltage terminal 120.

The first ESD block 150 is coupled between the intermediate node 130 and the first power supply voltage terminal 110. The first ESD block 150 is configured to direct an ESD pulse of a first polarity toward the first power supply voltage terminal 110 during an ESD event. The second ESD block 160 is coupled between the intermediate node 130 and the second power supply voltage terminal 120. The second ESD block 160 is configured to direct an ESD pulse of a second, opposite polarity toward the second power supply voltage terminal 120.

For example, when a positive ESD pulse 191 occurs at the RF input pad $RF_{in}$ and has a voltage higher than VDD, the first ESD block 150 conducts to thereby divert an ESD current caused by the positive ESD pulse 191 away from the RF circuit 180. Specifically, the ESD current flows from the RF input pad $RF_{in}$, via the intermediate node 130, to the first power supply voltage terminal 110. The ESD current causes a voltage surge on the first power supply voltage terminal 110 and, as a result, an excess voltage difference occurs across the power clamp 140. If the excess voltage difference is greater than the threshold voltage of the power clamp 140, the power clamp 140 conducts the ESD current from the first power supply voltage terminal 110 to the second power supply voltage terminal 120, thereby preventing the voltage surge on the first power supply voltage terminal 110 from damaging circuitry of the RF circuit 180.

If a negative ESD pulse 192 occurs at the RF input pad $RF_{in}$ and has a lower voltage than VSS, the second ESD block 160 conducts to divert an ESD current caused by the negative ESD pulse 192 away from the RF circuit 180. Specifically, the ESD current flows from the RF input pad $RF_{in}$, via the intermediate node 130, to the second power supply voltage terminal 120. The ESD current causes a voltage drop on the second power supply voltage terminal 120 and, as a result, an excess voltage difference occurs across the power clamp 140. If the excess voltage difference is greater than the threshold voltage of the power clamp 140, the power clamp 140 conducts current from the first power supply voltage terminal 110 to the second power supply voltage terminal 120, thereby preventing the voltage drop on the second power supply voltage terminal 120 from damaging circuitry of the RF circuit 180.

As a result of the protection action of the ESD protection circuit 100, ESD events occurring at the RF input pad $RF_{in}$ are unlikely to cause excess voltages to be applied to the circuitry of the RF circuit 180, thereby avoiding dielectric breakdown in various semiconductor devices of the RF circuit 180.

Several components of the ESD protection circuit 100, while useful for ESD protection purposes, are isolated from RF input signals at the RF input pad $RF_{in}$ during normal operation of the RF circuit 180. For example, the first ESD block 150 and/or second ESD block 160 include one or more elements, such as diodes, which have parasitic capacitance. At certain RF operating frequencies, such parasitic capacitance, if not isolated from the RF input pad begins to affect RF performance of the RF circuit 180.

The resonance circuit 170 is included in the ESD protection circuit 100 for isolating the parasitic capacitance from the RF input pad $RF_{in}$ during normal operation of the RF circuit 180. The resonance circuit 170 is coupled between the RF input pad $RF_{in}$ and the intermediate node 130 and is common to both the first ESD block 150 and the second ESD block 160. The resonance circuit 170 is configured to present various impedances to signals of various frequencies. Specifically, the resonance circuit 170 presents a greater impedance to signals of RF frequencies than to ESD pulses of much lower frequencies. Thus, during normal operation of the RF circuit 180, the resonance circuit 170 presents a large impedance to the RF input signal applied to the RF input pad $RF_{in}$. As a result, the first ESD block 150 and second ESD block 160, as well as their parasitic capacitance, are isolated from the RF input pad $RF_{in}$ by the large impedance of the resonance circuit 170 during normal operation of the RF circuit 180. During an ESD event, the resonance circuit 170 exhibits a much lower impedance to an ESD pulse at the RF input pad $RF_{in}$, and permits the ESD pulse to be conducted through to the intermediate node 130 and then to either the first power supply voltage terminal 110 or the second power supply voltage terminal 120 depending on the ESD pulse polarity. Functionality of both the ESD protection circuit 100 and the RF circuit 180 during ESD events and normal RF operation is therefore ensured.

In some embodiments, the resonance circuit 170 has a resonance frequency that matches an RF operating frequency of the RF circuit 180, or an RF operating frequency of the RF input signal applied to the RF circuit 180. The resonance frequency is considered to match the RF operating frequency if the resonance frequency is in a range from 80% to 120% of the RF operating frequency. In some embodiments, the resonance frequency is in a range from 90% to 110% of the RF operating frequency. In some embodiments, the resonance frequency is in a range from 95% to 105% of the RF operating frequency. With a resonance frequency that matches the RF operating frequency, the resonance circuit 170 is at or near resonance when an RF input signal of the RF operating frequency is applied to the RF input pad $RF_{in}$. The resonance circuit 170 then exhibits a very large, theoretically infinite, impedance to the RF input signal at the RF input pad $RF_{in}$ and effectively isolates the RF input pad $RF_{in}$ from parasitic capacitance of the first ESD block 150 and/or second ESD block 160 behind the resonance circuit 170. At a much lower frequency of an ESD event, the impedance of the resonance circuit 170 is very low, and ESD currents are permitted to flow through the resonance circuit 170 to other components of the ESD protection circuit 100. By including a common resonance circuit 170 for shielding both the first ESD block 150 and the second ESD block 160 from RF input signals, the circuit complexity and manufacture costs are reduced.

Figure 2:
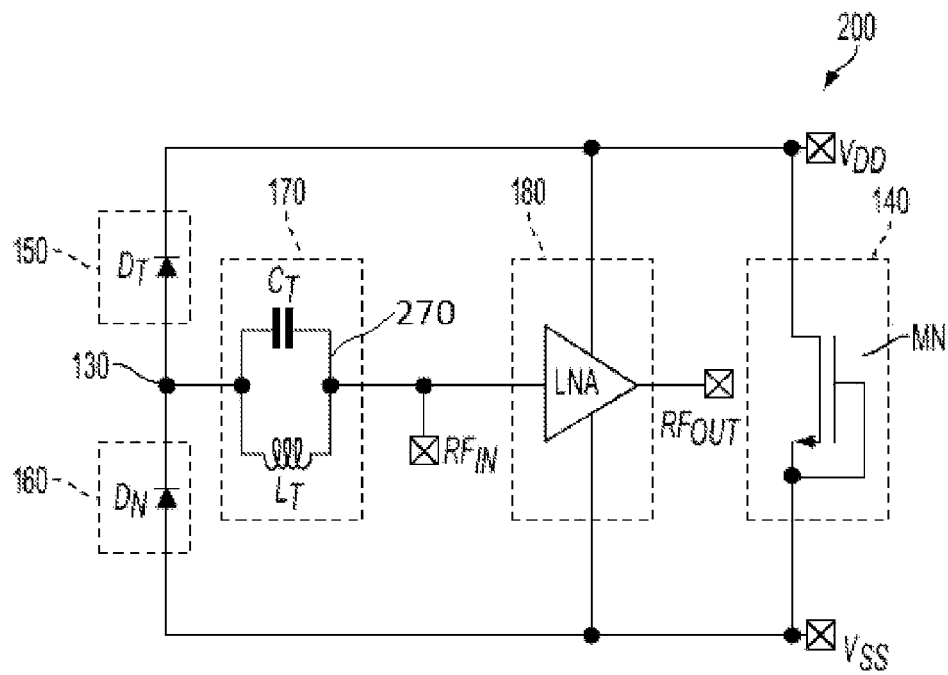
FIG. 2 is a schematic circuit diagram of an ESD protection circuit in accordance with some embodiments.

FIG. 2 is a schematic circuit diagram of an ESD protection circuit 200 in accordance with some embodiments. The ESD protection circuit 200 includes a diode $D_T$ which functions as the first ESD block 150, a diode $D_B$ which functions as the second ESD block 160, a gate-grounded n-channel metal-oxide semiconductor (NMOS) transistor MN which functions as the power clamp 140, and an LC resonance circuit 270 which functions as the resonance circuit 170.

The RF circuit 180 to be protected by the ESD protection circuit 200 is a low noise amplifier (LNA). In some embodiments, the LNA is coupled to the outside (e.g., via the RF output pad $RF_{out}$) by an antenna and is often exposed to ESD events. Other RF circuits are usable in some embodiments.

The diode $D_T$ has an anode coupled to the intermediate node 130 and a cathode coupled to the power supply voltage terminal VDD. The diode $D_B$ has an anode coupled to the ground voltage terminal VSS and a cathode coupled to the intermediate node 130. In some embodiments, other ESD block configurations are usable for the first ESD block 150 and/or the second ESD block 160 instead of one or both of the diode $D_T$ and diode $D_B$.

The NMOS transistor MN has a drain coupled to a power supply voltage terminal VDD, and a source and a gate commonly coupled to a ground voltage terminal VSS. During normal operation of the LNA without a voltage surge or drop on the power supply voltage terminal VDD or ground voltage terminal VSS, the NMOS transistor MN remains in the OFF state, because its gate-to-source voltage (zero) is less than a threshold voltage of the NMOS transistor MN. During an ESD event with a voltage surge on the power supply voltage terminal VDD, the voltage difference across the NMOS transistor MN exceeds a threshold value and the NMOS transistor MN undergoes snapback where the source, drain, and substrate of the NMOS transistor MN form a forward biased N-P-N bipolar junction transistor which conducts current from power supply voltage terminal VDD to ground voltage terminal VSS, thereby preventing the voltage surge from affecting the LNA. A similar snapback operation takes place when an excess voltage drop occurs on the ground voltage terminal VSS. In some embodiments, other power clamp configurations are usable instead of the NMOS transistor MN.

The LC resonance circuit 270 includes an inductor $L_T$ and an element that exhibits a capacitive characteristic at the RF operating frequency. In the particular embodiment of the ESD protection circuit 200, the element is a capacitor $C_T$. The inductor $L_T$ and capacitor $C_T$ are coupled in parallel between the RF input pad $RF_{in}$ and the intermediate node 130. In some embodiments, the LC resonance circuit 270 includes a resistor and functions as an RLC resonance circuit. In some embodiments, any connections among the inductor $L_T$, the capacitor $C_T$, any resistor included in the LC resonance circuit 270, the RF input pad $RF_{in}$ and the intermediate node 130 are usable, provided that the LC resonance circuit 270 has a resonance frequency that matches the RF operating frequency of the LNA.

During normal operation of the LNA, RF input signals at the RF input pad $RF_{in}$ are isolated from the diode $D_T$ and diode $D_B$ (and also from the diodes' parasitic capacitance) by the LC resonance circuit 270 as described with respect to the resonance circuit 170. When an ESD event occurs, the ESD current which has a much lower frequency than the RF operating frequency is transmitted through the inductor $L_T$ in the LC resonance circuit 270, to the intermediate node 130, and then either though the diode $D_T$ or the diode $D_B$ depending on the polarity of the ESD event.

In some embodiments, the inductor $L_T$ is the only inductor in the whole ESD protection circuit 200. In some embodiments, the inductor $L_T$ is the only inductor in both a first ESD current path from the RF input pad $RF_{in}$ to the intermediate node 130 and then to the power supply voltage terminal VDD, and a second ESD current path from the RF input pad $RF_{in}$ to the intermediate node 130 and then to the ground voltage terminal VSS. By including a single inductor, which often occupies a die area comparable to hundreds of other semiconductor components, the manufacturing and area costs of the ESD protection circuit 200 are reduced.

FIGS. 3A-3G are schematic circuit diagrams of various ESD protection circuits in accordance with some embodiments.

Figure 3A:
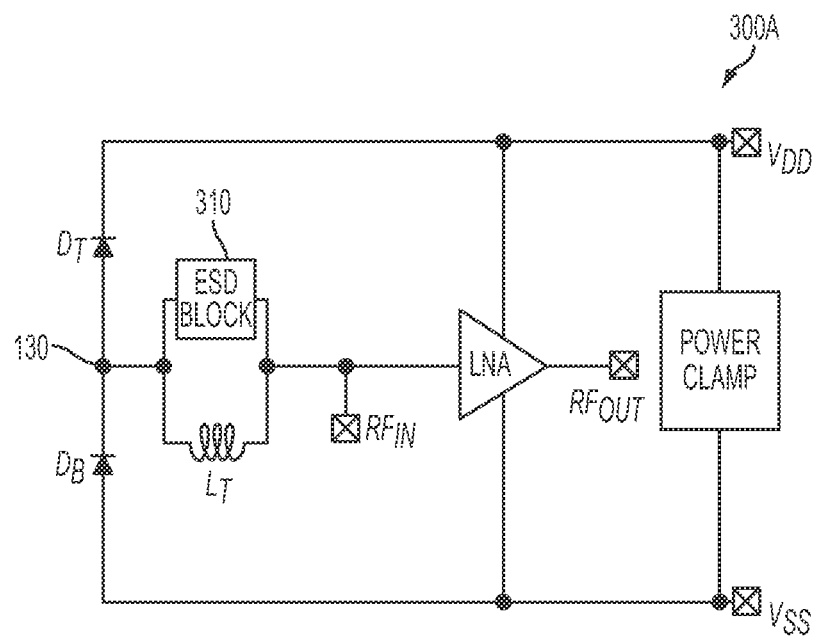
FIGS. 3A-3G are schematic circuit diagrams of various ESD protection circuits in accordance with some embodiments.

An ESD protection circuit 300A in FIG. 3A is similar to the ESD protection circuit 200, except that the capacitor $C_T$ of the ESD protection circuit 200 is replaced by an ESD block 310 which is coupled in parallel with the inductor $L_T$. As discussed with respect to the first ESD block 150 and the second ESD block 160, an ESD block, such as the ESD block 310, has parasitic capacitance which, under certain circumstances, becomes significant at the RF operating frequency of the LNA. By tuning the inductor $L_T$ based on the parasitic capacitance of the ESD block 310, a resonance frequency that matches the RF operating frequency of the LNA is achieved. As a result, the parasitic capacitance of the ESD block 310 is used, in combination with the inductor $L_T$, to isolate parasitic capacitance of the diode $D_T$ and diode $D_B$ from RF input signals during normal operation of the LNA. During an ESD event, the ESD block 310 performs the ESD protection function and conducts, in addition to the inductor $L_T$, the ESD current toward the diode $D_T$ and/or the diode $D_B$. Thus, multiple ESD current paths are provided which improves the ESD performance.

Figure 3B:
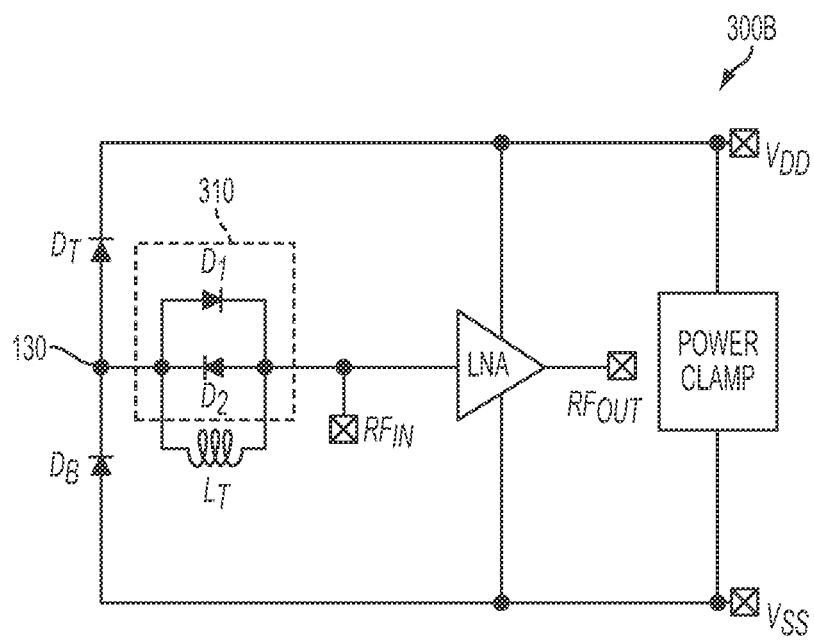
Figure 3C:
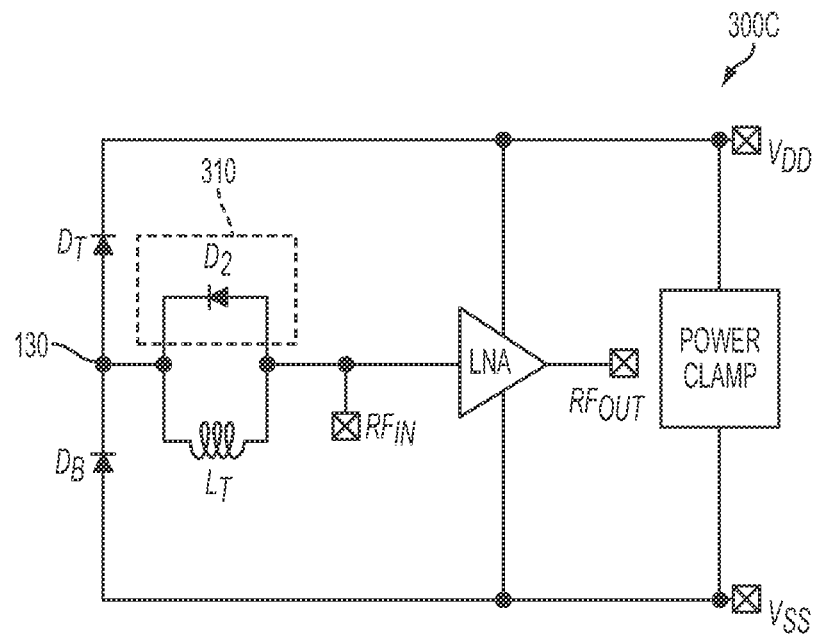
Figure 3D:
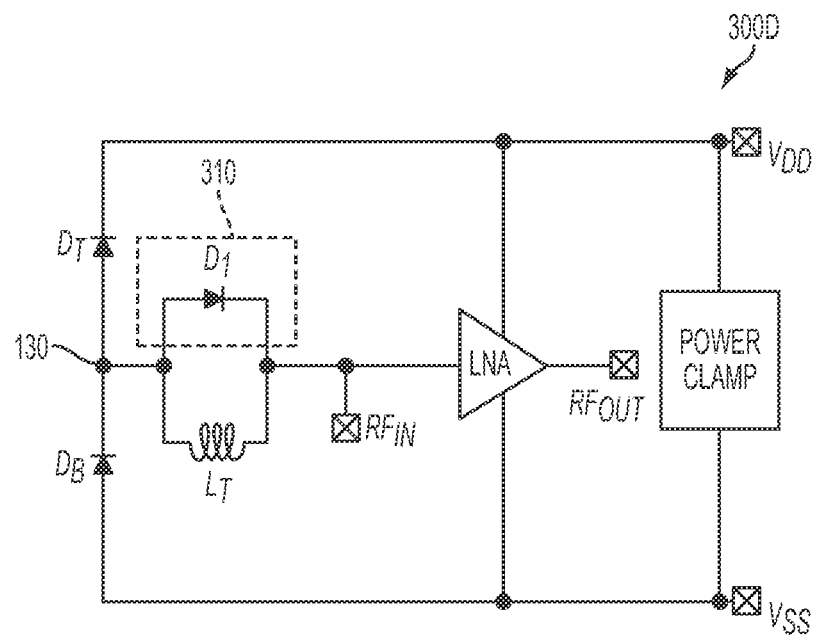

ESD protection circuits 300B, 300C, 300D in FIGS. 3B, 3C, 3D realize the ESD block 310 of the ESD protection circuit 300A by at least one diode. Specifically, the ESD protection circuit 300B in FIG. 3B realizes the ESD block 310 of the ESD protection circuit 300A by a pair of diode $D_1$ and diode $D_2$ both of which are coupled in parallel with the inductor $L_T$. The diode $D_1$ has an anode coupled to the intermediate node 130 and a cathode coupled to the RF input pad $RF_{in}$. The diode $D_2$ has an anode coupled to the RF input pad $RF_{in}$ and a cathode coupled to the intermediate node 130. By tuning the inductor $L_T$ based on the parasitic capacitance of both the diode $D_1$ and diode $D_2$, a resonance frequency that matches the RF operating frequency of the LNA is achieved. As a result, the parasitic capacitance of the diode $D_1$ and diode $D_2$ is used, in combination with the inductor $L_T$, to isolate parasitic capacitance of the diode $D_T$ and diode $D_B$ from RF input signals during normal operation of the LNA. During a positive ESD event, the diode $D_2$ conducts, in addition to the inductor $L_T$, the ESD current toward the diode $D_T$ and then to the power supply voltage terminal VDD. During a negative ESD event, the diode $D_1$ conducts, in addition to the inductor $L_T$, the ESD current toward the diode $D_B$ and then to the ground voltage terminal VSS. Thus, multiple ESD current paths are provided which improves the ESD performance.

The ESD protection circuit 300C in FIG. 3C realizes the ESD block 310 of the ESD protection circuit 300A by one diode $D_2$ coupled in parallel with the inductor $L_T$. By tuning the inductor $L_T$ based on the parasitic capacitance of the diode $D_2$, a resonance frequency that matches the RF operating frequency of the LNA is achieved. As a result, the parasitic capacitance of the diode $D_2$ is used, in combination with the inductor $L_T$, to isolate parasitic capacitance of the diode $D_T$ and diode $D_B$ from RF input signals during normal operation of the LNA. During a positive ESD event, the diode $D_2$ conducts, in addition to the inductor $L_T$, the ESD current toward the diode $D_T$ and then to the power supply voltage terminal VDD. During a negative ESD event, the ESD current is conducted by the inductor $L_T$ toward the diode $D_B$ and then to the ground voltage terminal VSS. Thus, multiple ESD current paths are provided which improves the ESD performance.

The ESD protection circuit 300D in FIG. 3D realizes the ESD block 310 of the ESD protection circuit 300A by one diode $D_1$ coupled in parallel with the inductor $L_T$. By tuning the inductor $L_T$ based on the parasitic capacitance of the diode $D_1$, a resonance frequency that matches the RF operating frequency of the LNA is achieved. As a result, the parasitic capacitance of the diode $D_1$ is used, in combination with the inductor $L_T$, to isolate parasitic capacitance of the diode $D_T$ and diode $D_B$ from RF input signals during normal operation of the LNA. During a positive ESD event, the ESD current is conducted by the inductor $L_T$ toward the diode $D_T$ and then to the power supply voltage terminal VDD. During a negative ESD event, the ESD current is conducted by the diode $D_1$, in addition to the inductor $L_T$, toward the diode $D_B$ and then to the ground voltage terminal VSS. Thus, multiple ESD current paths are provided which improves the ESD performance.

Figure 3E:
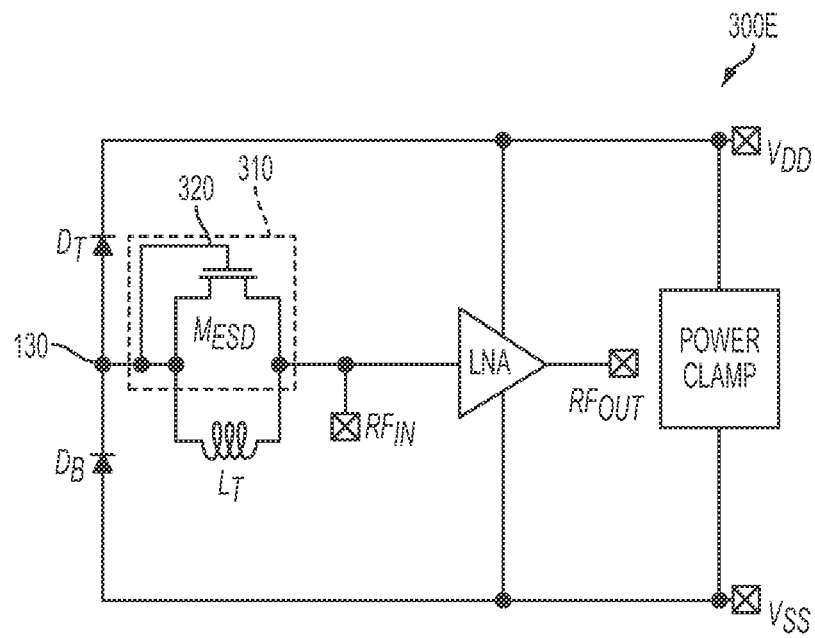

An ESD protection circuit 300E in FIG. 3E realizes the ESD block 310 of the ESD protection circuit 300A by an NMOS transistor 320. The NMOS transistor 320 has a source and a gate commonly coupled to the intermediate node 130, and a drain coupled to the RF input pad $RF_{in}$. The NMOS transistor 320 is configured and operates similarly to the gate-grounded NMOS transistor MN described with respect to FIG. 2. Specifically, the NMOS transistor 320 is normally closed, and becomes conductive during an ESD event. By tuning the inductor $L_T$ based on the parasitic capacitance of the NMOS transistor 320, a resonance frequency that matches the RF operating frequency of the LNA is achieved. As a result, the parasitic capacitance of the NMOS transistor 320 is used, in combination with the inductor $L_T$, to isolate parasitic capacitance of the diode $D_T$ and diode $D_B$ from RF input signals during normal operation of the LNA. During an ESD event, the NMOS transistor 320 becomes conductive and conducts, in addition to the inductor $L_T$, the ESD current toward the diode $D_B$ and/or diode $D_T$. Thus, multiple ESD current paths are provided which improves the ESD performance.

Figure 3F:
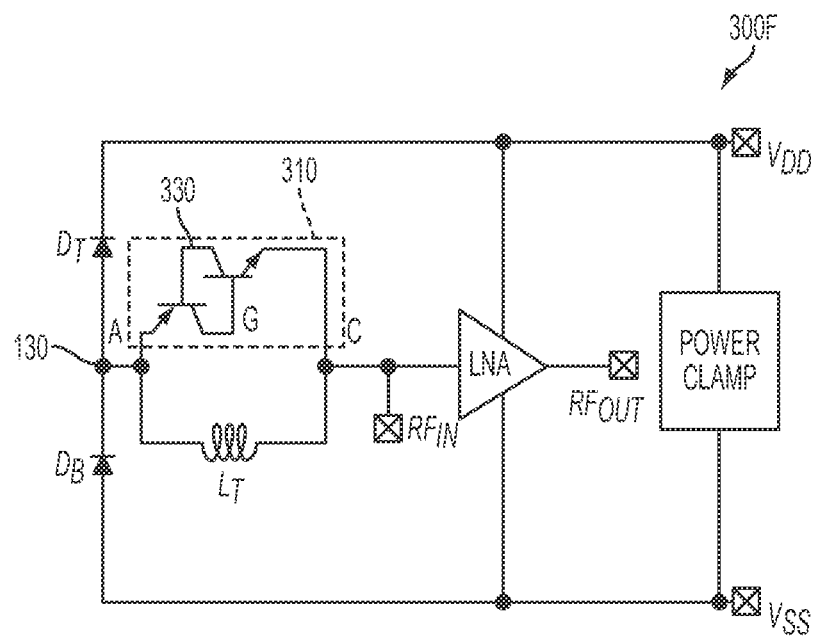

An ESD protection circuit 300F in FIG. 3F realizes the ESD block 310 of the ESD protection circuit 300A by a silicon-controlled rectifier (SCR) 330. The SCR 330 has an anode A coupled to the intermediate node 130, and a cathode C coupled to the RF input pad $RF_{in}$. A control gate G of the SCR 330 is floating. The SCR 330 operates similarly to the gate-grounded NMOS transistor MN described with respect to FIG. 2. Specifically, the SCR 330 is normally closed, and snapbacks to become conductive during an ESD event. By tuning the inductor $L_T$ based on the parasitic capacitance of the SCR 330, a resonance frequency that matches the RF operating frequency of the LNA is achieved. As a result, the parasitic capacitance of the SCR 330 is used, in combination with the inductor $L_T$, to isolate parasitic capacitance of the diode $D_T$ and diode $D_B$ from RF input signals during normal operation of the LNA. During an ESD event, the SCR 330 becomes conductive and conducts, in addition to the inductor $L_T$, the ESD current toward the diode $D_B$ and/or diode $D_T$. Thus, multiple ESD current paths are provided which improves the ESD performance.

Figure 3G:
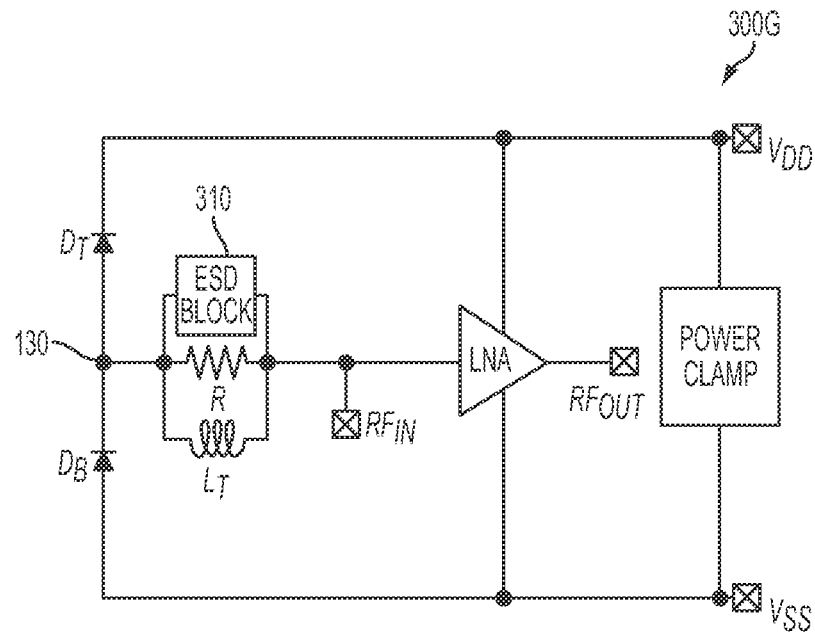

An ESD protection circuit 300G in FIG. 3G is similar to the ESD protection circuit 300A, except that a resistor R is coupled in parallel to the ESD block 310 and the inductor $L_T$. Specifically, the resistor R has a first end coupled to the RF input pad $RF_{in}$ and a second, opposite end coupled to the intermediate node 130. In some embodiments, a resistance value of the resistor R is in a range from a few ohms to a few megaohms. By tuning the inductor $L_T$ and/or the resistance value of the resistor R based on the parasitic capacitance of the ESD block 310, a resonance frequency that matches the RF operating frequency of the LNA is achieved. The presence of the resistor R permits easy tuning of the resonance frequency of the LC resonance circuit 270. The ESD protection circuit 300G operates similarly to the ESD protection circuit 300A, except that during an ESD event, the ESD current is conducted by not only the inductor $L_T$ but also the resistor R. Thus, multiple ESD current paths are provided which improves the ESD performance.

Figure 4:
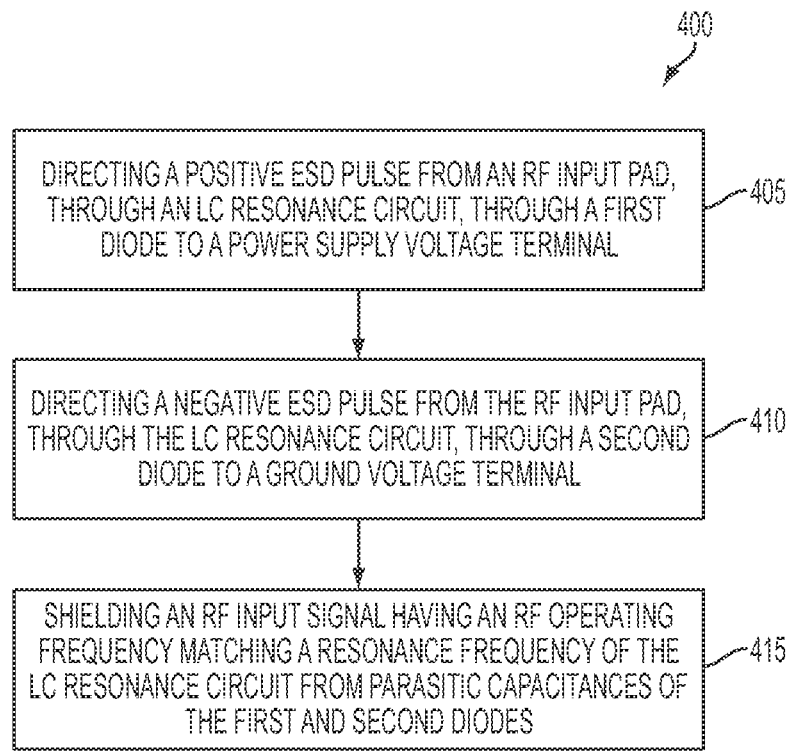
FIG. 4 is a flow chart of an ESD protection method in accordance with some embodiments.

FIG. 4 is a flow chart of an ESD protection method 400 in accordance with some embodiments. At step 405, upon occurrence of a first ESD pulse (e.g., 191) of a positive polarity at an RF input pad $RF_{in}$ of the RF semiconductor device, the first ESD pulse is transmitted along a first ESD current path from the RF input pad $RF_{in}$, through a resonance circuit (e.g., 270), to an intermediate node 130, then through a first diode (e.g., diode $D_T$) to a power supply voltage terminal VDD of the RF semiconductor device.

At step 410, upon occurrence of a second ESD pulse (e.g., 192) of a negative polarity at the RF input pad $RF_{in}$, the second ESD pulse is transmitted along a second ESD current path from the RF input pad $RF_{in}$, through the resonance circuit 270, to the intermediate node 130, then through a second diode (e.g., diode $D_B$) to a ground voltage terminal VSS of the RF semiconductor device. Thus, the resonance circuit 270 is common to both the first and second ESD current paths.

At step 415, upon application of an RF input signal, which has an RF operating frequency matching a resonance frequency of the resonance circuit 270, to the RF input pad $RF_{in}$, the resonance circuit 270 exhibits very large impedance to the RF input signal and shields the RF input signal and the RF input pad from parasitic capacitances of the first and second diodes. By using a common resonance circuit for isolating both first and second diodes from RF input signals, manufacture and area costs are reduced.

The above method embodiment shows exemplary steps, but they are not necessarily required to be performed in the order shown. Steps may be added, replaced, changed order, and/or eliminated as appropriate, in accordance with the spirit and scope of embodiments of the disclosure. Embodiments that combine different features and/or different embodiments are within scope of the disclosure and will be apparent to those skilled in the art after reviewing this disclosure.

According to some embodiments, an electrostatic discharge (ESD) protection circuit for a radio frequency (RF) semiconductor device comprises a first power supply voltage terminal configured to receive a first power supply voltage, and a second power supply voltage terminal configured to receive a second power supply voltage. A power clamp is coupled between the first and second power supply voltage terminals. An RF input pad is configured to receive an RF input signal having an RF operating frequency for the RF semiconductor device. A first ESD block is coupled between an intermediate node and the first power supply voltage terminal, to direct an ESD pulse of a first polarity toward the first power supply voltage terminal. A second ESD block is coupled between the intermediate node and the second power supply voltage terminal, to direct an ESD pulse of a second, opposite polarity toward the second power supply voltage terminal. A resonance circuit is coupled between the RF input pad and the intermediate node. The resonance circuit is configured to present a greater impedance to the RF input signal having the RF operating frequency than to the ESD pulses.

According to some embodiments, a radio frequency (RF) semiconductor device comprises: a power supply voltage terminal, a ground voltage terminal and an intermediate node. An internal RF circuit to be protected from ESD pulses is coupled to the power supply voltage terminal and ground voltage terminal. A power clamp is coupled between the power supply voltage terminal and the ground voltage terminal. An RF input pad is coupled to the internal RF circuit and configured to receive an RF input signal having an RF operating frequency for the internal RF circuit. A first diode has an anode coupled to the intermediate node and a cathode coupled to the power supply voltage terminal. A second diode has a cathode coupled to the intermediate node and an anode coupled to the ground voltage terminal. An LC resonance circuit is coupled between the RF input pad and the intermediate node. The LC resonance circuit includes an inductor which is the only inductor in an ESD current path from the RF input pad to the intermediate node and then to the power supply voltage terminal and the ground voltage terminal.

According to some embodiments, in a method of protecting a radio frequency (RF) semiconductor device from ESD events, upon occurrence of a first ESD pulse of a positive polarity at an RF input pad of the RF semiconductor device, the first ESD pulse is transmitted from the RF input pad, through an LC resonance circuit, to an intermediate node, through a first diode to a power supply voltage terminal of the RF semiconductor device. Upon occurrence of a second ESD pulse of a negative polarity at the RF input pad, the second ESD pulse is transmitted from the RF input pad, through the LC resonance circuit, to the intermediate node, through to a second diode to a ground voltage terminal of the RF semiconductor device.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An electrostatic discharge (ESD) protection circuit for a radio frequency (RF) semiconductor device, said electrostatic discharge protection circuit comprising:

a first power supply voltage terminal configured to receive a first power supply voltage;

a second power supply voltage terminal configured to receive a second power supply voltage;

a power clamp coupled between the first and second power supply voltage terminals;

an RF input pad configured to receive an RF input signal having an RF operating frequency for the RF semiconductor device;

an intermediate node;

a first ESD block coupled between the intermediate node and the first power supply voltage terminal, the first ESD block configured to direct an ESD pulse of a first polarity toward the first power supply voltage terminal;

a second ESD block coupled between the intermediate node and the second power supply voltage terminal, the second ESD block configured to direct an ESD pulse of a second, opposite polarity toward the second power supply voltage terminal; and a resonance circuit coupled between the RF input pad and the intermediate node, the resonance circuit configured to present a greater impedance to the RF input signal having the RF operating frequency than to the ESD pulses, wherein the resonance circuit is included in both a first ESD current path from the RF input pad to the intermediate node and then to the first power supply voltage terminal, and a second ESD current path from the RF input pad to the intermediate node and then to the second power supply voltage terminal.

2. The electrostatic discharge protection circuit of claim 1, wherein the resonance circuit has a resonance frequency in a range from 80% to 120% of the RF operating frequency of the RF input signal.

3. The electrostatic discharge protection circuit of claim 1, wherein the resonance circuit includes an inductor and an element that exhibits a capacitive characteristic at the RF operating frequency.

4. The electrostatic discharge protection circuit of claim 3, wherein the inductor is the only inductor in the whole electrostatic discharge protection circuit.

5. The electrostatic discharge protection circuit of claim 3, wherein the element is a capacitor.

6. The electrostatic discharge protection circuit of claim 3, wherein the element includes at least one diode.

7. The electrostatic discharge protection circuit of claim 3, wherein the element includes a further ESD block.

8. The electrostatic discharge protection circuit of claim 1, further comprising a resistor coupled between the RF input pad and the intermediate node.

9. A radio frequency (RF) semiconductor device, comprising:

a power supply voltage terminal;

a ground voltage terminal;

an internal RF circuit to be protected from ESD pulses, the internal RF circuit coupled to the power supply voltage terminal and ground voltage terminal;

a power clamp coupled between the power supply voltage terminal and the ground voltage terminal;

an RF input pad coupled to the internal RF circuit and configured to receive an RF input signal having an RF operating frequency for the internal RF circuit;

an intermediate node;

a first diode having an anode coupled to the intermediate node and a cathode coupled to the power supply voltage terminal;

a second diode having a cathode coupled to the intermediate node and an anode coupled to the ground voltage terminal; and an LC resonance circuit coupled between the RF input pad and the intermediate node, wherein the LC resonance circuit includes an inductor which is included in both a first ESD current path from the RF input pad to the intermediate node and then to the power supply voltage terminal, and a second ESD current path from the RF input pad to the intermediate node and then to the ground voltage terminal.

10. The RF semiconductor device of claim 9, wherein the inductor is the only inductor in both the first ESD current path and the second ESD current path.

11. The RF semiconductor device of claim 9, wherein a resonance frequency of the LC resonance circuit is from 80% to 120% of the RF operating frequency of the RF input signal.

12. The RF semiconductor device of claim 9, wherein the LC resonance circuit further includes a capacitor coupled in parallel with the inductor between the RF input pad and the intermediate node.

13. The RF semiconductor device of claim 9, wherein the LC resonance circuit further includes a third diode coupled in parallel with the inductor.

14. The RF semiconductor device of claim 9, wherein the LC resonance circuit further includes a third diode coupled in parallel with the inductor, the third diode having a cathode coupled to the RF input pad and an anode coupled to the intermediate node, and a fourth diode coupled in parallel with the inductor, the fourth diode having an anode coupled to the RF input pad and a cathode coupled to the intermediate node.

15. The RF semiconductor device of claim 9, wherein the LC resonance circuit further includes an ESD block coupled in parallel with the inductor between the RF input pad and the intermediate node.

16. The RF semiconductor device of claim 15, wherein the LC resonance circuit further includes a resistor coupled in parallel with both the inductor and the ESD block between the RF input pad and the intermediate node.

17. The RF semiconductor device of claim 9, wherein the LC resonance circuit further includes an n-channel metal-oxide semiconductor (NMOS) transistor having a source and a gate commonly coupled to the intermediate node, and a drain coupled to the RF input pad.

18. The RF semiconductor device of claim 9, wherein the LC resonance circuit further includes a silicon-controlled rectifier (SCR) having an anode coupled to the intermediate node, a cathode coupled to the RF input pad, and a floating control terminal.

19. A method of protecting a radio frequency (RF) semiconductor device from electrostatic discharge (ESD) events, said method comprising:

transmitting a first ESD pulse from an RF input pad, through a resonance circuit, to an intermediate node, then through a first diode to a power supply voltage terminal of the RF semiconductor device responsive to occurrence of the first ESD pulse of a positive polarity at the RF input pad of the RF semiconductor device; and transmitting a second ESD pulse from the RF input pad, through the resonance circuit, to the intermediate node, then through a second diode to a ground voltage terminal of the RF semiconductor device responsive to occurrence of the second ESD pulse of a negative polarity at the RF input pad.

20. The method of claim 19, wherein
the resonance circuit shields the RF input pad from parasitic capacitances of the first and second diodes responsive to application of an RF input signal, the RF input signal having an RF operating frequency matching a resonance frequency of the resonance circuit, to the RF input pad.

* * * * *